Figure 1:
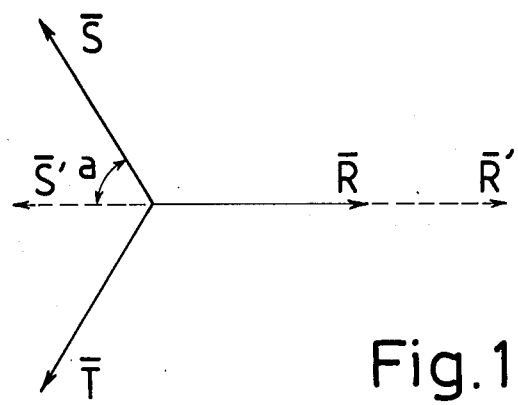

United States Patent [19]

Kähkipuro et al.

[11] Patent Number: 4,480,283
[45] Date of Patent: Oct. 30, 1984

[54] PROCEDURE AND MEANS FOR MONITORING THE PHASE SEQUENCE IN A THREE-PHASE NETWORK

[75] Inventors: Matti Kähkipuro; Heimo Mäkinen, both of Hyvinkää, Finland

[73] Assignee: Elevator GmbH, Baar, Switzerland

[21] Appl. No.: 276,947

[22] Filed: Jun. 24, 1981

[51] Int. Cl.³ .............................................. H02H 3/26
[52] U.S. Cl. ........................................ 361/76; 361/77
[58] Field of Search .................. 361/33, 76, 77, 85, 361/185; 324/86, 108; 340/658; 307/127

[56] References Cited

U.S. PATENT DOCUMENTS

| 3,992,651 | 11/1976 | Hodges | 361/76 |
| 4,023,075 | 5/1977 | Reuter | 361/76 |
| 4,067,053 | 1/1978 | Chow | 361/76 |
| 4,210,948 | 7/1980 | Waltz | 361/76 |
| 4,284,939 | 8/1981 | Kawada et al. | 361/77 X |

Primary Examiner—Harry E. Moose, Jr.

[57] ABSTRACT

Procedure for monitoring the phase sequence in a three-phase network, for instance in lift operation. Between the normal voltage vectors (R,S,T) indicating the phases are added extra vectors (R',S') which are mutually opposed and equal vectors, and that the extra vectors (R',S') and the voltage vectors (R,S,T) are added up and on the basis of the sum thus obtained, necessary steps are taken.

5 Claims, 2 Drawing Figures

PROCEDURE AND MEANS FOR MONITORING THE PHASE SEQUENCE IN A THREE-PHASE NETWORK

The present invention concerns a procedure for monitoring the phase sequence in a three-phase network, for instance in lift operation.

In general, correct phase sequence is important especially in connection with lifts. If the phase sequence is wrong, danger situations may arise e.g. in that the doors move the wrong way, and in lifts with thyristor-operated static converters a phase sequence error causes the fuses to blow. The need to monitor the phase sequence is obvious in connection with lifts, and it is in fact required by the lift regulations in certain countries.

Such phase sequence monitoring means are commonly known which operate digitally, employing for instance so-called delay microcircuits. They are usually encumbered by a comlex circuitry and a great number of components, whereby these means have a great tendency to malfunction.

The present invention aims to eliminate the drawbacks mentioned and to provide a reliable, simple and inexpensive phase sequence monitoring arrangement.

The procedure of the invention is characterized in that between the normal voltage vectors indicating the phases are added extra vectors which are mutually opposed and equal vectors, and that the extra vectors and voltage vectors are added up and on the basis of the sum obtained, necessary steps are taken.

One embodiment of the invention is characterized in that the extra vectors are produced in that of the vector of one phase is formed a component lagged by 60 degrees, and which is compensated by suitably lengthening the vector of the phase leading this phase by 120 degrees.

The invention also concerns a circuit for carrying out the said procedure. In the circuit, the sum of the phases is formed and introduced in an operator amplifier circuit, and the remaining in zero state of this circuit is monitored by means of a window comparator, of which the output signal controls a relay or another equivalent control member. The circuit of the invention is characterized in that into the phase to which a lag of 60 degrees is caused has been connected a delay circuit in parallel with the summing resistor of this phase, and that the summing resistor connected into the phase leading the lagged phase by 120 degrees is suitably smaller of its value than the summing resistors in the other phases.

A preferred embodiment of the circuit is characterized in that the delay circuit has been composed of at least two series-connected delay resistors and a delay capacitor, one terminal whereof has been connected to ground and the other terminal between the delay resistors.

The advantage of the procedure and of the means is a simple and clear-cut circuit, which is easy to dimension. The simple and inexpensive means has the further advantage that it may very well be employed in connection with the lift installation work to facilitate the attaining of a correct phase sequence at the installation stage already.

The invention is described in the following more closely with the aid of an example and with reference to the attached drawings, wherein:

FIG. 1 displays a three-phase system in vector presentation, and

Figure 2:
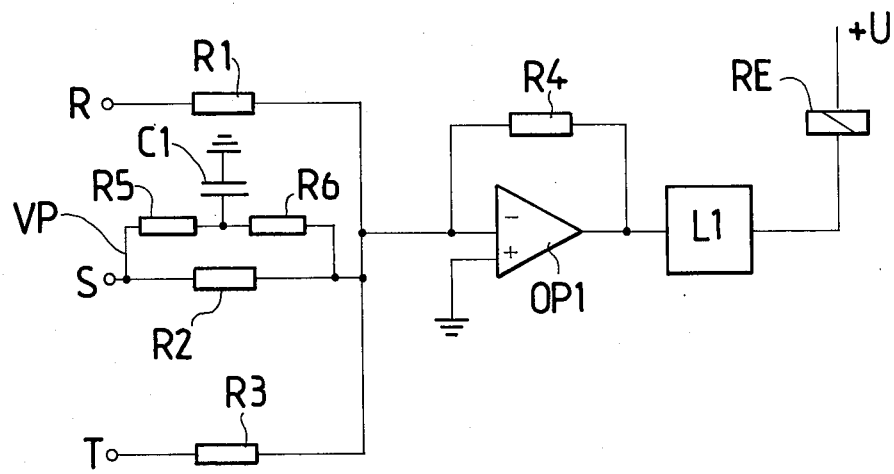

FIG. 2 shows the circuit of a means carrying out the procedure.

The phase sequence monitoring is based on the circumstance that any three-phase system can be presented in the form of a certain vector diagram, comprising vectors R, S and T representing each phase. The mathematical procedure applied in this vector procedure is to build up, at first, a circuit which calculates the sum of the said vectors, which is always zero. A circuit of this kind cannot yet be used to monitor the phase sequence because the vector sum is zero regardless of the sequence of the phases. When in this circuit a modification is made consisting of forming, e.g. from the S vector, an extra component S' lagged by 60 degrees and of correspondingly lengthening the R vector so that the first-mentioned change is compensated, then the sum of the vectors is not always zero. It is understood that in this case there are inroduced the extra vectors S' and R' in addition to the vectors R, S and T, and the circuit thus obtained is phase-sensing. If the phase sequence is inverted, the extra vectors S' and R' will no longer cancel each other and the consequence is, instead, a vector sum differing from zero. It could be further imagined, on a mathematical basis, that such compensation would be performed by lagging one phase by a degrees and correspondingly advancing the next phase by 120-a degrees, or by advancing the preceding phase by a degrees. These steps have the same effect as the extra vectors S' and R' just described. There are however limitations in practice which restrict the last-mentioned possibilities. If a is small, the lagging angle of 120-a degrees will be large, and such lagging is difficult to accomplish with any simple components. Likewise, the advancing of a vector is inconvenient because in that case the resulting circuit will be sensitive to interference.

The circuit itself is built up, using operator amplifiers. The summing resistor in the R phase is R1, that in phase S is R2, and that in phase T is R3. The feedback resistor of the operator amplifier OP1 is R4. The lagging of the S phase vector is accomplished by adding in the S phase of the circuit a delay circuit VP in parallel with the summing resistor R2. The delay circuit consists of at least two series-connected delay resistors R5 and R6, between which has been connected a delay capacitor C1, of which the other terminal is grounded. Similarly, the lengthening of the R vector is accomplished by reducing the value of resistor R1, compared with the other summing resistors. If in this circuit the output voltage of the operator amplifier OP1 is different from zero, this is indication of the condition that the phase sequence is wrong. In that case a member is needed which controls a relay or another equivalent control means, through which the signal goes further to the lift's safety circuit so as to stop the incorrect function. This member, known as a window comparator L1, can be carried out according to technology known in the art and therefore its construction is not described here.

It is obvious to a person skilled in the art that the invention is not exclusively confined to the example presented above and that instead its different embodiments may vary within the scope of the claims following hereinbelow.

We claim:

1. A method of monitoring the phase sequence in a three-phase network, comprising the steps of: producing normal voltage vectors indicating the phases, between said normal voltage vectors producing extra vectors which are mutually opposed and equal vectors, and adding up the extra vectors and the normal voltage vectors and on the basis of the sum thus obtained, monitoring the network.

2. A method according to claim 1, wherein the extra vectors are produced by forming from the vector of one phase a component lagging 60 degrees behind, and compensating said vector by suitably lengthening the vector of the phase preceding said one phase.

3. A circuit for monitoring the phase sequence in a three-phase network having a summing resistor in each phase, comprising an operator amplifier circuit for forming a sum of the phases, a window comparator for monitoring the remaining in zero state of said circuit, said comparator having an output signal controlling a control member; one of said phases lagging by 60 degrees, and another phase leading said lagging phase by 120 degrees, a delay circuit in said one phase, said delay circuit being in parallel with said lagging phase's summing resistor, and the summing resistor incorporated in said other phase being suitably smaller in value than the summing resistors in the other phases.

4. A circuit according to claim 3, wherein said control member is a relay.

5. A circuit according to claim 3 or 4 wherein the delay circuit comprises at least two series-connected delay resistors, and a delay capacitor having one terminal connected to ground and the other between said delay resistors.

* * * * *